United States Patent [19]
Lee et al.

[11] Patent Number: 5,026,657
[45] Date of Patent: Jun. 25, 1991

[54] SPLIT-POLYSILICON CMOS DRAM PROCESS INCORPORATING SELF-ALIGNED SILICIDATION OF THE CELL PLATE, TRANSISTOR GATES, AND N+ REGIONS

[75] Inventors: Ruojia Lee; Tyler A. Lowrey; Fernando Gonzalez; Joseph J. Karniewicz; Pierre C. Fazan, all of Boise, Id.

[73] Assignee: Micron Technology, Inc., Boise, Id.

[21] Appl. No.: 491,784

[22] Filed: Mar. 12, 1990

[51] Int. Cl.$^5$ ............... H01L 21/265; H01L 21/336; H01L 27/092; H01L 27/108
[52] U.S. Cl. .................................. 437/47; 437/44; 437/52; 437/57; 437/34; 357/23.6
[58] Field of Search ............... 437/40, 41, 44, 34, 437/56, 57, 47, 48, 50, 52, 54, 59, 60, 196, 200, 233; 357/23.6; 148/DIG. 147

[56] References Cited

U.S. PATENT DOCUMENTS

| | | | |
|---|---|---|---|
| 4,561,170 | 12/1985 | Doering et al. | 437/48 |
| 4,871,688 | 10/1989 | Lowrey | 437/48 |
| 4,945,066 | 7/1990 | Kang et al. | 437/47 |
| 4,957,878 | 9/1990 | Lowrey et al. | 437/47 |

FOREIGN PATENT DOCUMENTS

| | | | |
|---|---|---|---|
| 0017164 | 1/1982 | Japan | 437/34 |
| 0213051 | 10/1985 | Japan | 437/44 |
| 0165355 | 7/1987 | Japan | 437/233 |
| 2150349 | 6/1985 | United Kingdom | 437/48 |

Primary Examiner—Olik Chaudhuri
Assistant Examiner—M. Wilczewski
Attorney, Agent, or Firm—Angus C. Fox, III; Stanley N. Protigal; Albert Crowder, Jr.

[57] ABSTRACT

A split-polysilicon CMOS DRAM process incorporating self-aligned silicidation of the cell plate, transistor gates and N+ regions with a minimum of additional processing steps. By employing a light oxidation step to protect the P-channel transistor sidewall gates from silicidation during a subsequent processing step, the process avoids the problems that may be created by the double etching of the field oxide and active area regions that has heretofore been required for self-aligned silidation utilizing a split-polysilicon CMOS process. A protective nitride layer is used to prevent oxidation on those regions which are to be silicided. When this improved process is utilized for DRAM fabrication, the protective nitride layer may also be utilized as the cell dielectric. Although this process precludes the silicidation of the sources and drains of P-channel transistors, silicidation of other important regions is accomplished with very few steps required beyond those required for the basic split-polysilicon CMOS process without self-aligned silicidation of conductive regions.

10 Claims, 11 Drawing Sheets

SPLIT-POLYSILICON CMOS DRAM PROCESS INCORPORATING SELF-ALIGNED SILICIDATION OF THE CELL PLATE, TRANSISTOR GATES, AND N+ REGIONS

FIELD OF THE INVENTION

This invention relates to semiconductor technology and, more specifically, to processes for creating dynamic random access memories using CMOS technology. This invention is primarily concerned with a process, to be used in conjunction with a split-polysilicon CMOS process, for the self-aligned silicidation of the cell plate, the gates of both N-channel and P-channel transistors and N+ regions (except those which are covered by the cell plate) using a minimum number of processing steps.

BACKGROUND OF THE INVENTION

Most current-generation dynamic random access memories (DRAMs) utilize CMOS technology. Although the term "CMOS" is an acronym for (C)omplementary (M)etal (O)xide (S)emiconductor, the term CMOS is now more loosely applied to any integrated circuit in which both N-channel and P-channel field-effect transistors are used in a complementary fashion. Although CMOS integrated circuit devices are often referred to as "semiconductor" devices, such devices are fabricated from various materials which are either electrically conductive, electrically nonconductive or electrically semiconductive. Silicon, the most commonly used semiconductor material can be made conductive by doping it (introducing an impurity into the silicon crystal structure) with either an element such as boron which has one less valence electron than silicon, or with an element such as phosphorus or arsenic which have one more valence electron than silicon. In the case of boron doping, electron "holes" become the charge carriers and the doped silicon is referred to as positive or P-type silicon. In the case of phosphorus or arsenic doping, the additional electrons become the charge carriers and the doped silicon is referred to as negative or N-type silicon. If a mixture of dopants having opposite conductivity types is used, counter doping will result, and the conductivity type of the most abundant impurity will prevail. Silicon is used either in single-crystal or polycrystalline form. Polycrystalline silicon is referred to hereinafter as "polysilicon" or simply as "poly". Although polysilicon has largely replaced metal for the MOS device gates, the inherently high conductivity of a metal has led many semiconductor manufacturers to create a layer of refractory metal silicide on transistor gates in order to increase device speed.

CMOS DRAM processes begin with a lightly-doped P-type or N-type silicon substrate. Suffice it to be said that, prior to the development of the split-polysilicon CMOS process, fabrication of a CMOS DRAM memory required at least 12 photoresist masking steps to create both N-channel and P-channel transistors and the cell capacitor on a silicon substrate (an additional one or two masks is required if lightly-doped drain design is required for both types of transistors). No attempt is made at siliciding source and drain regions in this process.

A pending U.S. patent application No. 07/427,639, submitted by Tyler A. Lowrey, Randal W. Chance, and Ward D. Parkinson of Micron Technology, Inc. of Boise, Id. provides a detailed description of the heretofore mentioned split-polysilicon CMOS process. By processing N-channel and P-channel devices separately, three photomasking steps can be eliminated in the manufacture of high-performance CMOS circuits. As with the conventional CMOS process, a single polysilicon layer is used to form both N-channel and P-channel gates. However, N-channel devices are formed first, with an expanse of unetched polysilicon left in the future P-channel regions until N-channel processing is complete.

Another copending patent application No. 07/485,029 entitled "Split Polysilicon CMOS Process Incorporating Self-Aligned Silicidation of Conductive Regions" and submitted by Tyler Lowrey, Mark Durcan, Trung Doan, Gordon Haller, and Mark Tuttle (all of Micron Technology, Inc.) builds on the standard split polysilicon CMOS process by incorporating self-aligned silicidation of all conductive regions (i.e., gates, sources and drains of both N-channel and P-channel transistors). This process requires the deposition and anisotropic dry etch of a transistor sidewall spacer oxide layer for each transistor type. The spacers are used not only to offset transistor source/drain implants, but to prevent silicidation of the transistor gate sidewalls. Using this process, both spacer etch steps must be carefully monitored in order to prevent excessive etching of the field isolation oxide and the doped silicon in the active areas which function as the sources and drains for both types of transistors. Any significant removal of this doped silicon will degrade transistor performance, specifically with regard to junction leakage. Hence, poor control over the spacer etches may lead to poor manufacturing yields.

SUMMARY OF THE INVENTION

The process which is the subject of the present invention avoids the N-channel sidewall spacer and active area etch problem of the aforementioned split-polysilicon silicide process by employing a light oxidation step to protect the P-channel transistor sidewall gates from a subsequent silicidation step. A protective nitride layer is used to prevent oxidation on those regions which are to be silicided. When this improved process is utilized for DRAM fabrication, the protective nitride layer may also be utilized as the cell dielectric. The improved process departs from the standard process flow disclosed in the two pending patent applications relating to the split-polysilicon CMOS process following sidewall spacer formation on the N-channel transistor gates. At this point, a first silicon nitride layer is blanket deposited on top of all circuitry. The blanket deposition of a layer of polysilicon, from which the cell plate will be created, follows. If it is desirable to significantly lower the sheet resistance of the cell plate in a subsequent silicidation step, a second silicon nitride layer is blanket deposited on top of the polysilicon layer. Following masking of the polysilicon layer (or nitride-coated polysilicon layer) with a second photomask, an etch step creates the cell plate and exposes the first nitride layer in the regions not covered by the cell plate. A third photomask is then used to cover all N-channel devices and to pattern the gates of the P-channel transistors. The third photomask is then left in place during P-channel source/drain implants. Following the stripping of the third photomask, a thin layer of oxide is grown on all exposed silicon (i.e., the edges of P-channel transistor gates and the edges of the cell plate). Following a nitride strip which exposes the sources and drains of the N-channel transistors (except where covered by the cell plate) and the upper surfaces of the cell plate and of both N-channel and P-channel transistor gates, those exposed regions are silicided in a self-aligned silicidation step. Although this process precludes the silicidation of the sources and drains of P-channel transistors, silicidation of other important regions is accomplished with very few steps required beyond those required for the basic split-polysilicon CMOS process without self-aligned silicidation of conductive regions.

PREFERRED EMBODIMENT OF THE INVENTION

Since the focus of this disclosure is a silicidation process for use in conjunction with the existing split-polysilicon CMOS process, the split-poly process flow will be covered in this disclosure only to the extent required to understand the silicidation process flow in the proper context. The circuit cross section depicted in FIGS. 1 through 12 is not an actual circuit, but rather a representative circuit which incorporates the significant features of a CMOS DRAM circuit.

Figure 1:
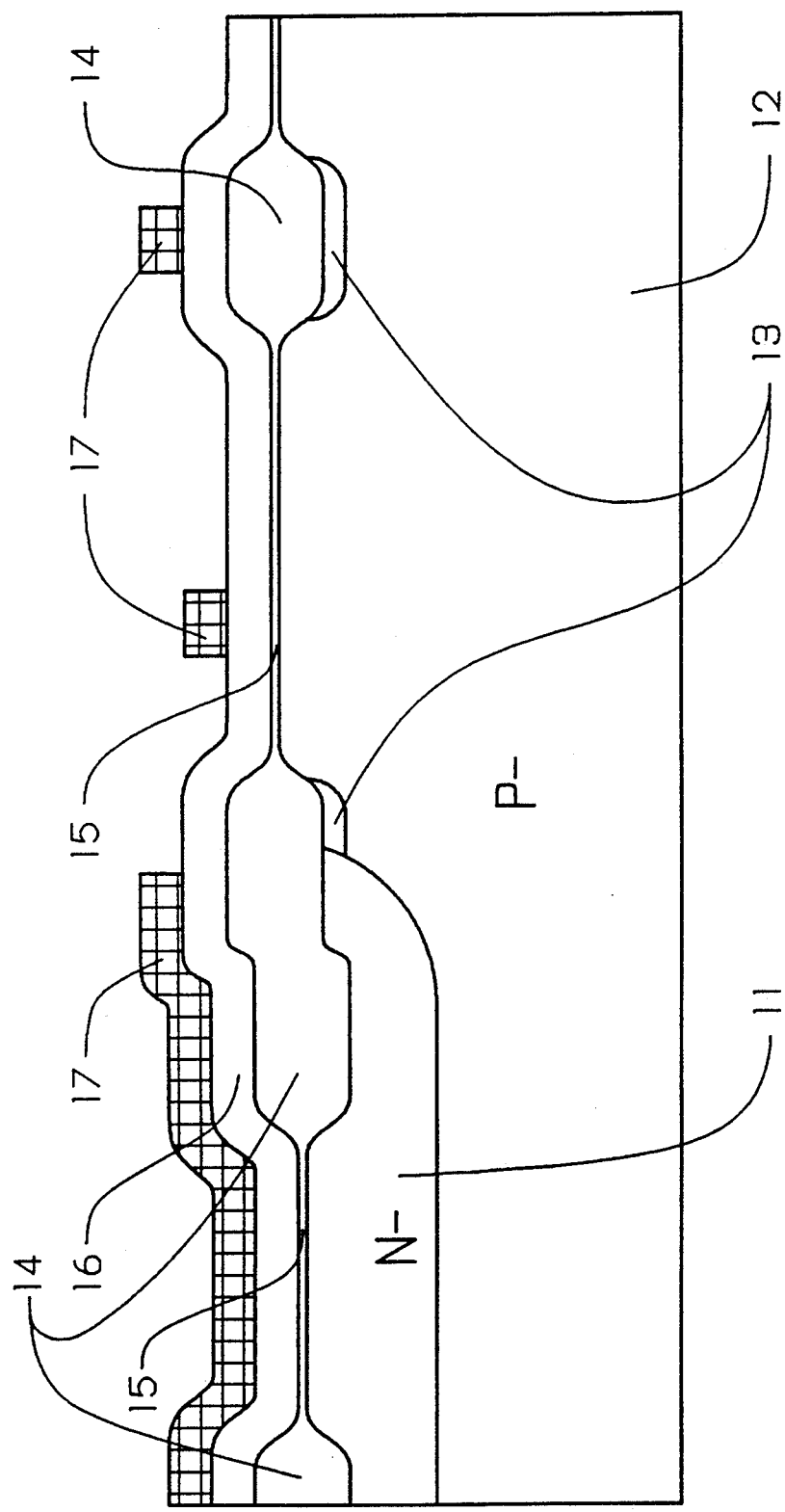
FIG. 1 is a cross-sectional view of a representative CMOS circuit during the fabrication following the creation of an N-well within a lightly-doped P-type substrate, a masked boron field isolation implant, creation of field oxide regions using conventional LOCOS, an unmasked, boron transistor threshold enhancement implant, deposition of a first polysilicon layer, doping of the first polysilicon layer, and masking of the first polysilicon layer with a first photomask.

Referring now to FIG. 1, a cross-sectional view of a CMOS dynamic random access memory (DRAM) circuit is shown during fabrication following the conventional creation of a well of lightly-doped N-type material (N-well) 11 within a monocrystalline silicon substrate of lightly-doped P-type material 12, a masked boron field isolation implant 13, creation of field oxide regions 14 using conventional local oxidation of silicon (LOCOS), thermal growth of a gate oxide layer 15 an unmasked, boron transistor threshold enhancement implant, deposition of a first polysilicon layer 16, doping of the first polysilicon layer, and masking of the first polysilicon layer with a first photoresist mask 17 (hereinafter also photomask). As previously disclosed in the split-polysilicon process, the first photomask is used to pattern the gates of the N-channel transistor gates and interconnects and to cover or blanket the N-well (P-channel) regions.

Figure 2:
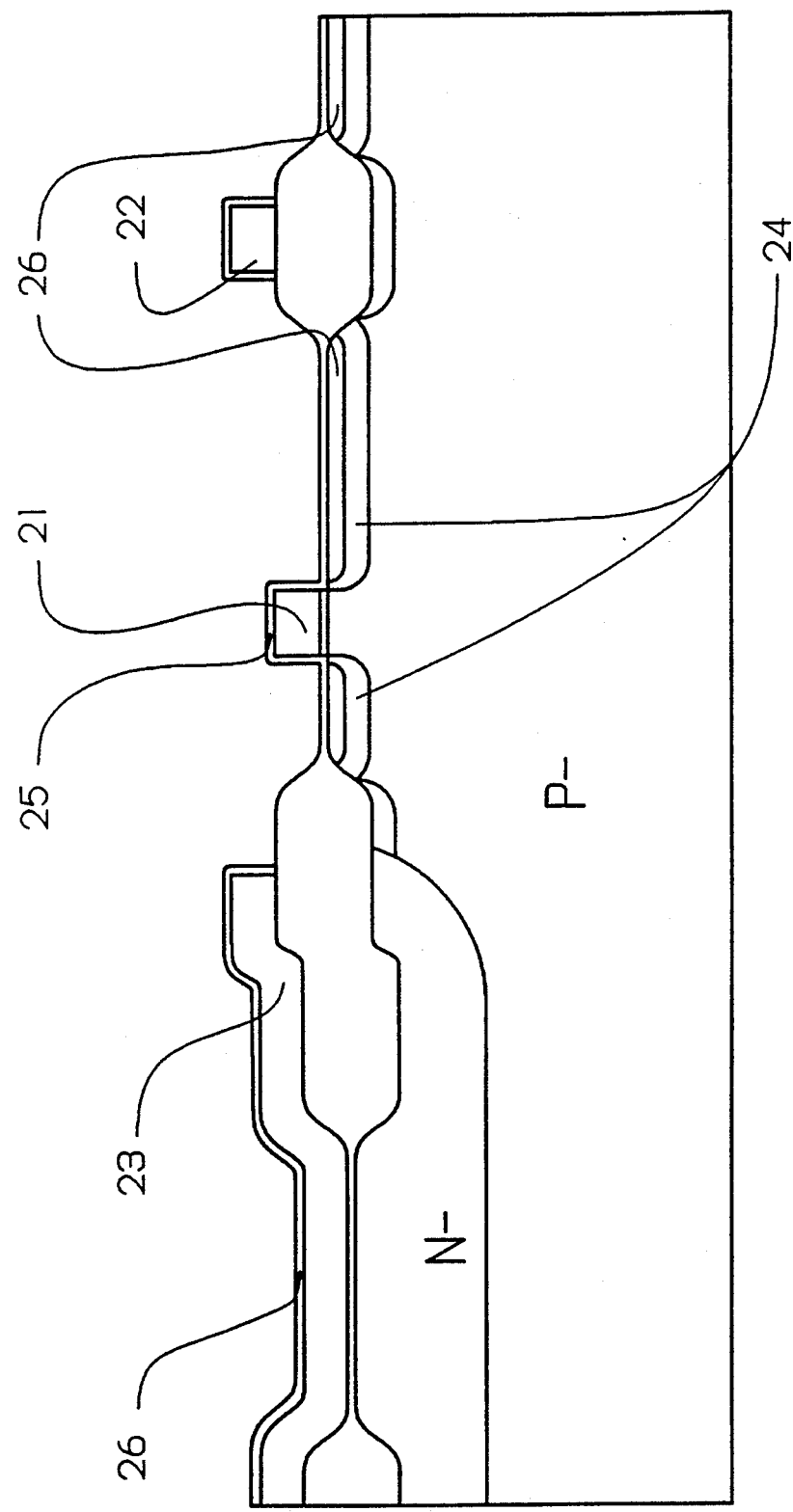
FIG. 2 is a cross-sectional view of the circuit of FIG. 1 following a first etch of the first poly layer, stripping of the first photomask, a subsequent boron punch-through implant, followed by an oxidation of N-channel source and drain regions as well as the exposed surfaces of all polysilicon, and a low-dosage N-channel source/drain lightly-doped drain (LDD) implant.

Referring now to FIG. 2, following a first polysilicon etch is preferably an anisotropic dry etch, which creates the N-channel transistor gates 21, N-channel interconnects 22, and creates an expanse of unetched poly 23 in the N-well region, the first photomask is stripped. Following a blanket, self-aligned, low-dosage boron punch-through implant which creates lightly-doped, P-type punch-through implant regions 24 that extend to the edges of the N-channel transistor gates 21, a thermal oxidation or chemical vapor deposition (CVD) is employed to create a mini-spacer oxide layer 25 having a thickness in the range of 300 to 1500 angstroms. The purpose of mini-spacer oxide layer 25 is to coat the sides of transistor gates 21, so that when the circuitry is subjected to a low-dosage phosphorus implant, self-aligned lightly-doped N-type regions 26 are created in the N-channel source/drain regions 23 of the N-channel transistors, said N- regions being offset from the vertical boundaries of punch-through implant regions 24. It should be noted that mini spacer oxide layer 25 has also covered N-channel source/drain regions 23.

Figure 3:
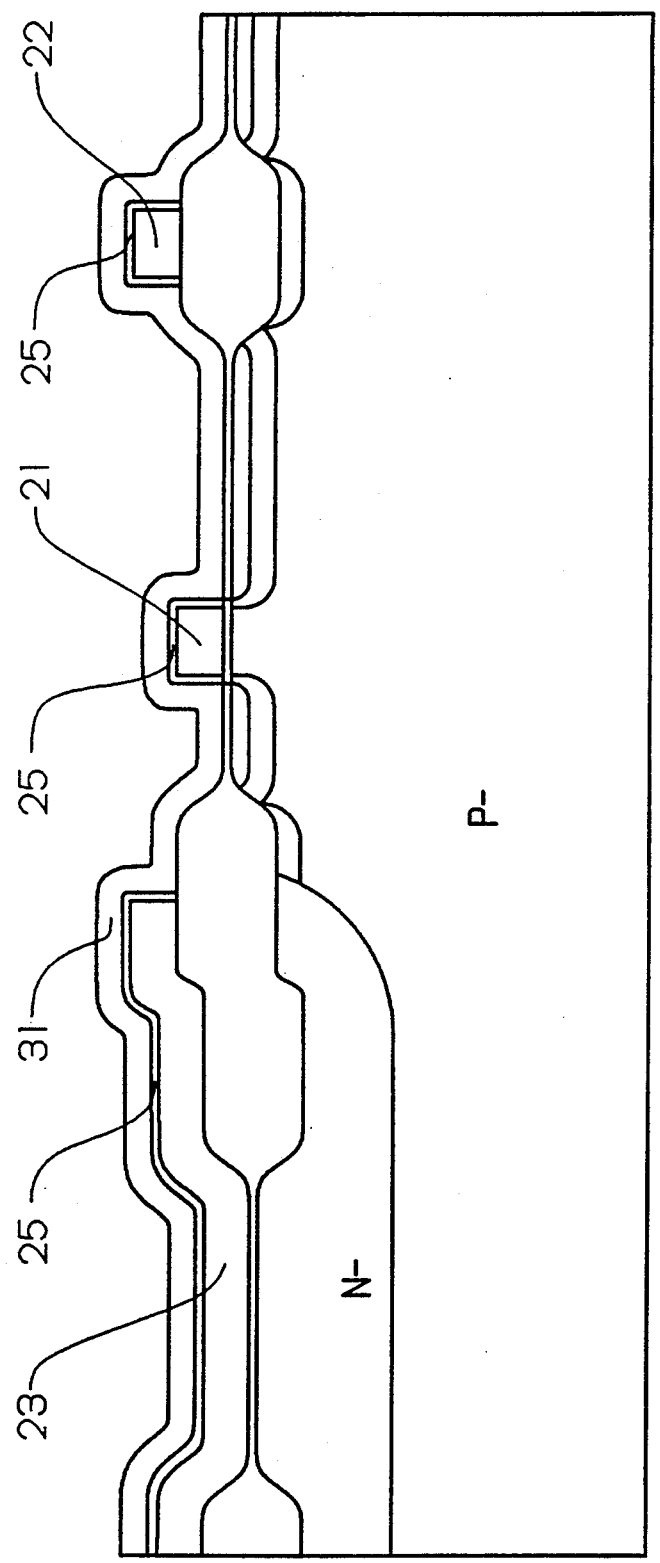
FIG. 3 is a cross-sectional view of the circuit of FIG. 2 following the blanket deposition of a spacer oxide layer.

Referring now to FIG. 3, a silicon dioxide spacer layer 31 has been blanket deposited on top of all circuitry through chemical vapor deposition.

Figure 4:
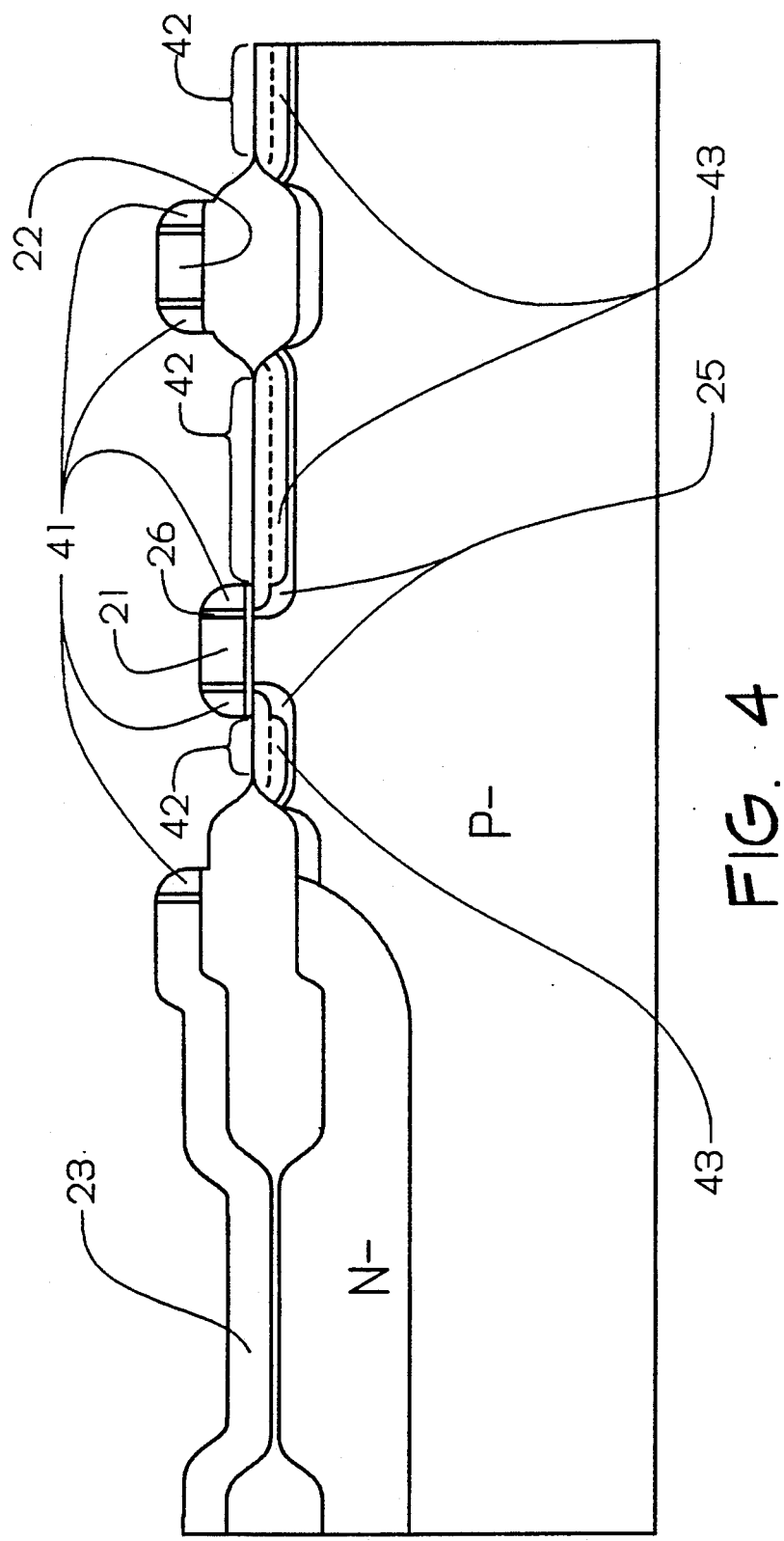
FIG. 4 is a cross-sectional view of the circuit of FIG. 3 following an anisotropic etch of the spacer oxide layer and a high-dosage N-channel source/drain implant.

Referring now to FIG. 4, an anisotropic etch and an optional isotropic etch (in that order) of the oxide spacer layer 31 has created oxide spacers 41 on the sides of the N-channel transistor gates 21, the N-channel interconnects 22 and the unetched expanse of polysilicon 23 in the N-well region 11. The anisotropic and isotropic etches clear the N-channel source/drain regions 42 (also referred to as active areas) of all oxide. Spacer formation is followed by a high-dosage blanket phosphorus or arsenic implant, which creates heavily-doped N+ regions 43 of the N-channel sources and drains. Doping of the poly layer in the P-channel regions with the aforementioned N-channel implants will have essentially no effect on P-channel transistor performance, since only the gate poly is implanted, with the future P-channel source and drain regions remaining untouched. Implantation of the gate poly has little effect due to the much higher, dominant doping concentration obtained from the doping step prior to the initial patterning of first poly layer 16.

Figure 5:
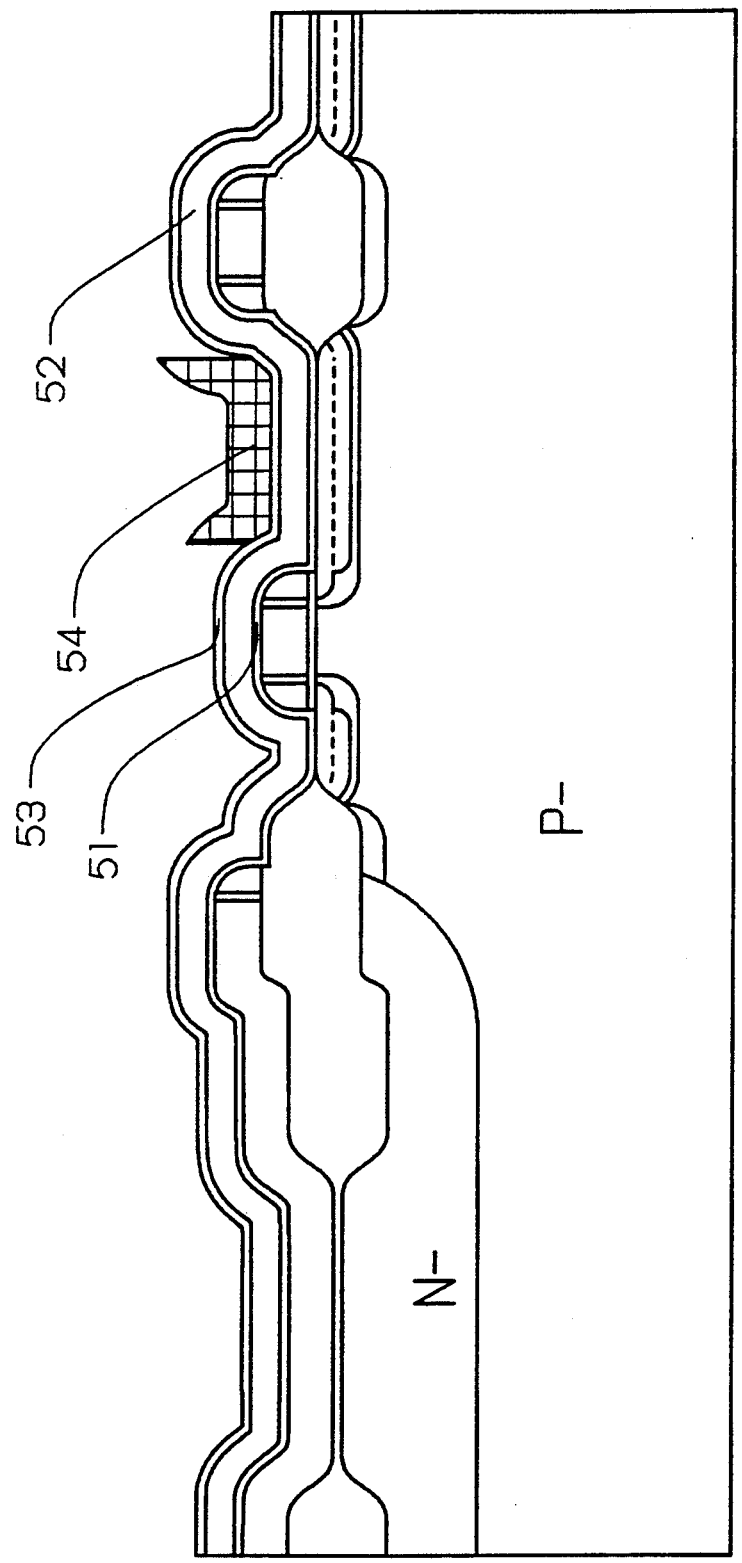
FIG. 5 is a cross-sectional view of the circuit of FIG. 4 following the blanket deposition of a first nitride layer, the blanket deposition of a second poly layer, the blanket deposition of an optional second nitride layer, and masking of the second nitride layer with a second photomask.

Referring now to FIG. 5, a first silicon nitride layer 51 has been blanket deposited on top of all circuitry, followed by the blanket deposition of a second polysilicon layer 52 is performed. If it is desirable have a silicided cell plate, the deposition of the second polysilicon layer is followed by the blanket deposition of a second nitride layer 53. The second polysilicon layer 52 (or the nitride coated second polysilicon layer) is then masked with a second photomask 54.

Figure 6:
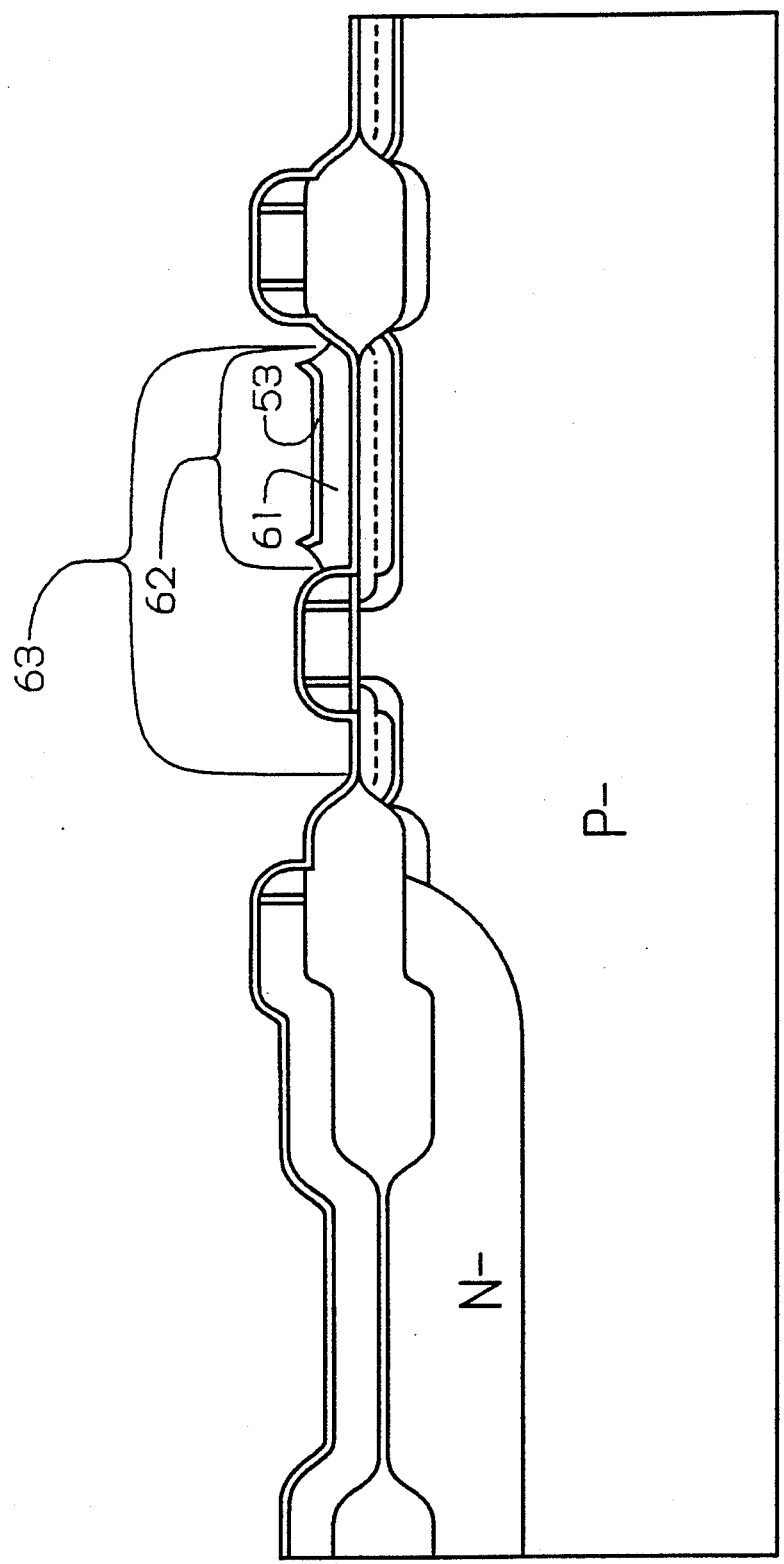
FIG. 6 is a cross-sectional view of the circuit of FIG. 5 following an etch of the second nitride layer and the second poly layer.

Referring now to FIG. 6, if the second poly layer 52 is nitride coated, a second-poly-layer-clearing etch is required to remove those portions of the second nitride layer 53 that are not subjacent to second photomask 54. In any case, a second polysilicon etch (preferably an etch which is highly-selective for polysilicon) is used to remove those portions of the second poly layer 52 that are not subjacent to second photomask 54. The etch of the second poly layer (or the nitride-coated second poly layer) has created a cell plate 61, which in this cross-section is shown as occupying the capacitive region 62 of a now structurally-complete DRAM cell 63. Second photo mask 54 is now stripped.

Figure 7:
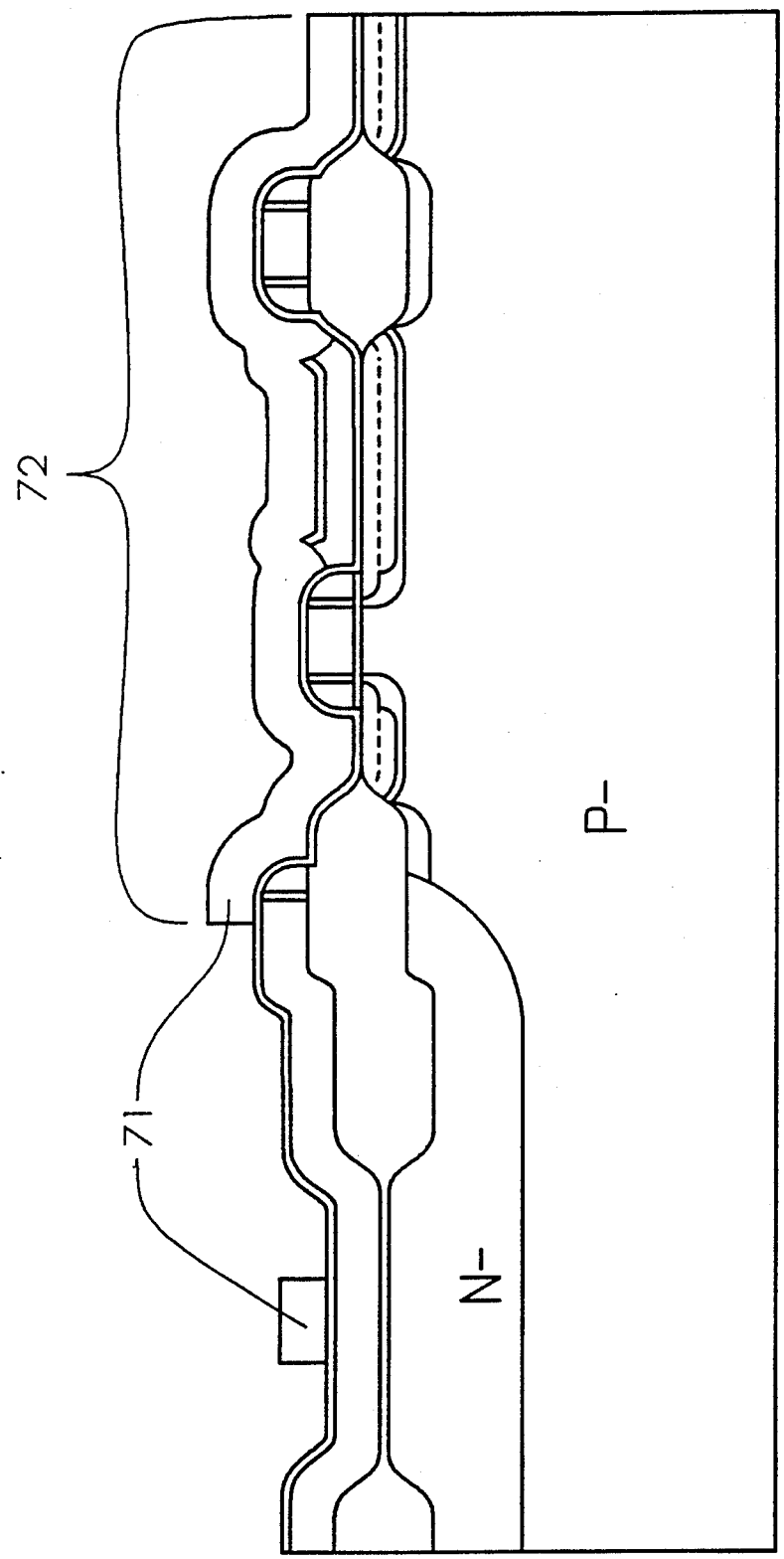
FIG. 7 is a cross-sectional view of the circuit of FIG. 6 following the stripping of the second photomask, and masking of the circuitry with a third photomask which covers the N-channel regions and patterns the P-channel transistors.

Referring now to FIG. 7, the circuitry is masked with a third photomask 71 which completely covers the N-channel regions 72 and patterns the P-channel transistors.

Figure 8:
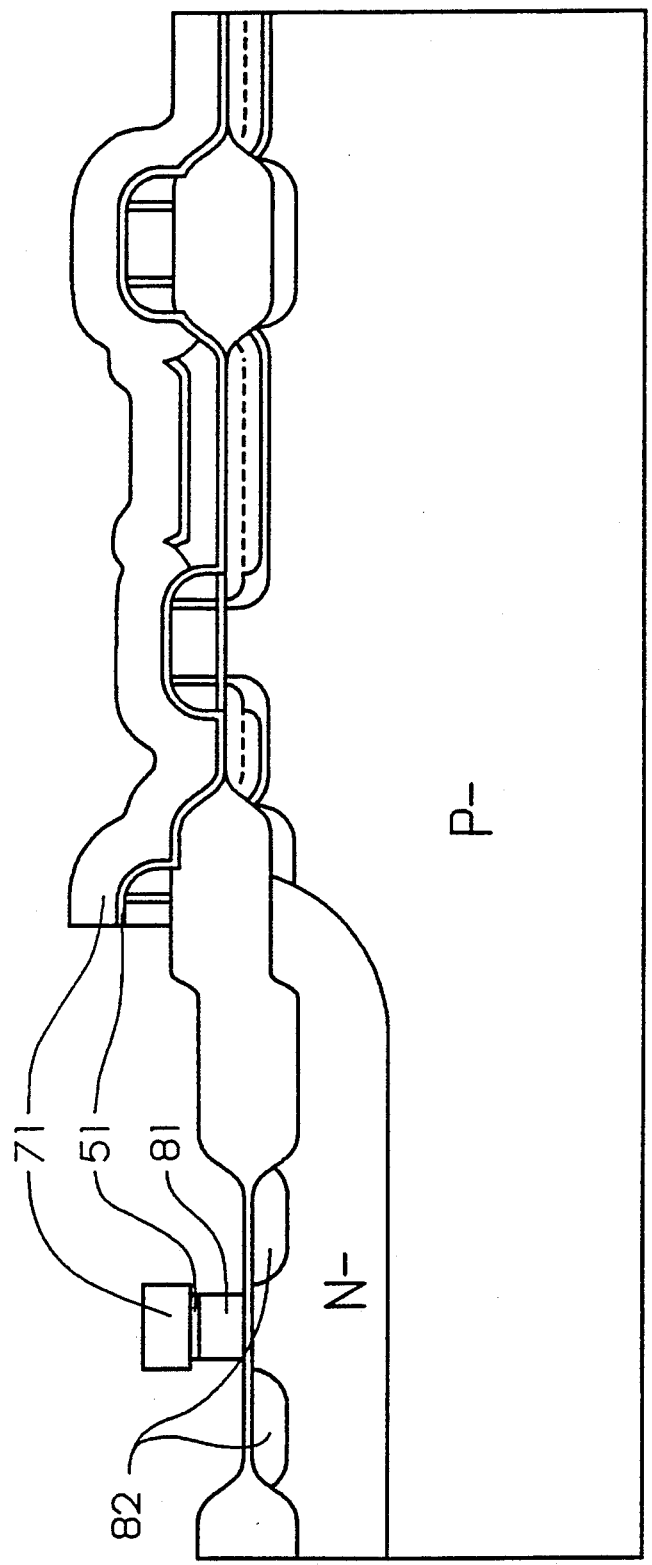
FIG. 8 is a cross-sectional view of the circuit of FIG. 7 following an etch of those portions of the first nitride layer and the first poly layer that are within the N-well regions, thus creating the P-channel transistor gates.

Referring now to FIG. 8, a first-poly-layer-clearing nitride etch has removed exposed portions of the first nitride layer 51. Following the removal of exposed nitride, a third polysilicon etch (in this case, an isotropic etch) is used to etch away those portions of first poly layer 16 that were exposed by the removal of the nitride, thus creating P-channel transistor gates 81. It will be noted that, as a result of this isotropic etch, the P-channel gates 81 are recessed under the edges of the third photomask 71. The third photomask 71 is left intact during high-dosage boron or boron difluoride P-channel implant in order to offset the implant away from the edges of the P-channel gates. The high-dosage boron or boron difluoride implant creates P-channel source/drain regions 82.

Figure 9:
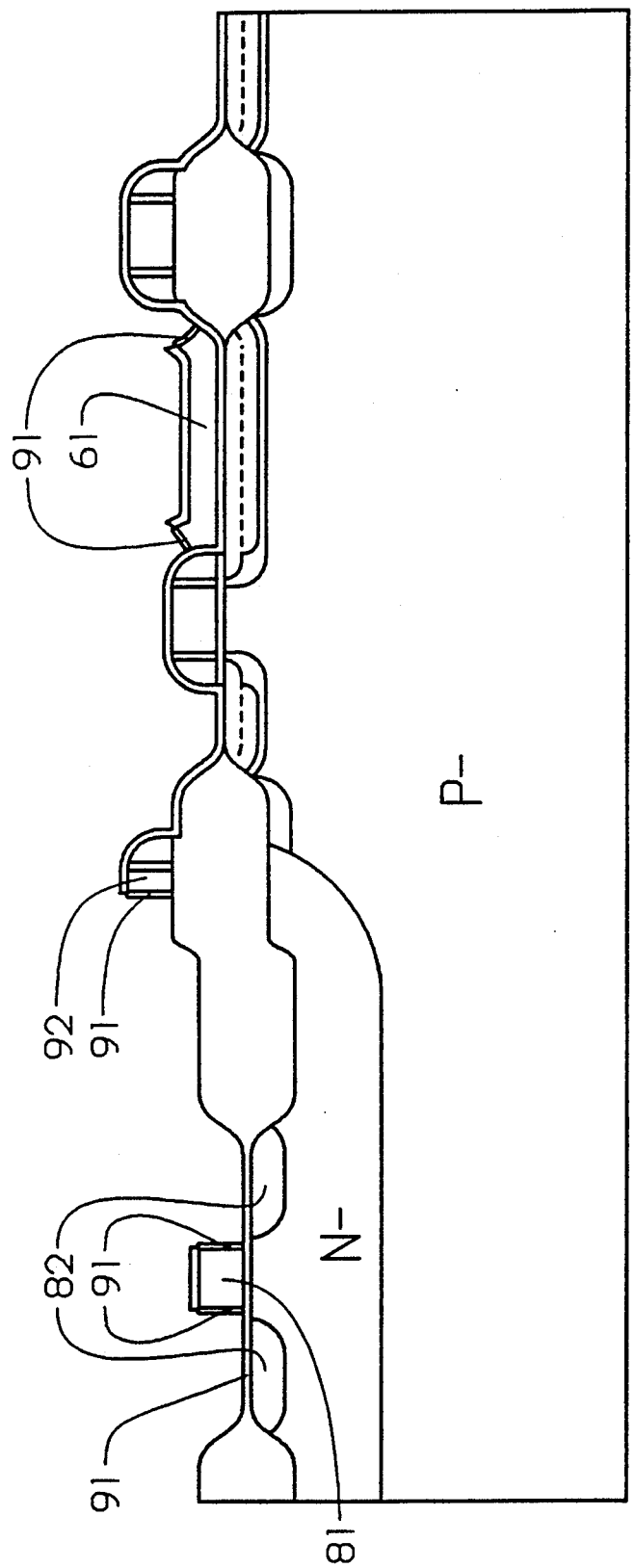
FIG. 9 is a cross-sectional view of the circuit of FIG. 8 following stripping of the third photomask and oxidation of all exposed silicon (i.e., the P-channel sources, drains, and gate sidewalls, the edges of the second poly layer or the entire surface of the second poly layer if no second nitride layer is used, and the edge of the hedge)

Referring now to FIG. 9, following the stripping of the third photomask 71, a wet oxidation step creates a thin oxide coating 91 (approximately 30-1500 angstroms thick) on all exposed silicon (i.e., the P-channel source/drain regions 82, the sidewalls of P-channel gates 81, the edges of cell plate 61, or the entire surface the cell pate 61 if no second nitride layer is used, and the edge of the hedge 92 that is merely an artifact of the split-poly process resulting from photomask overlap).

Figure 10:
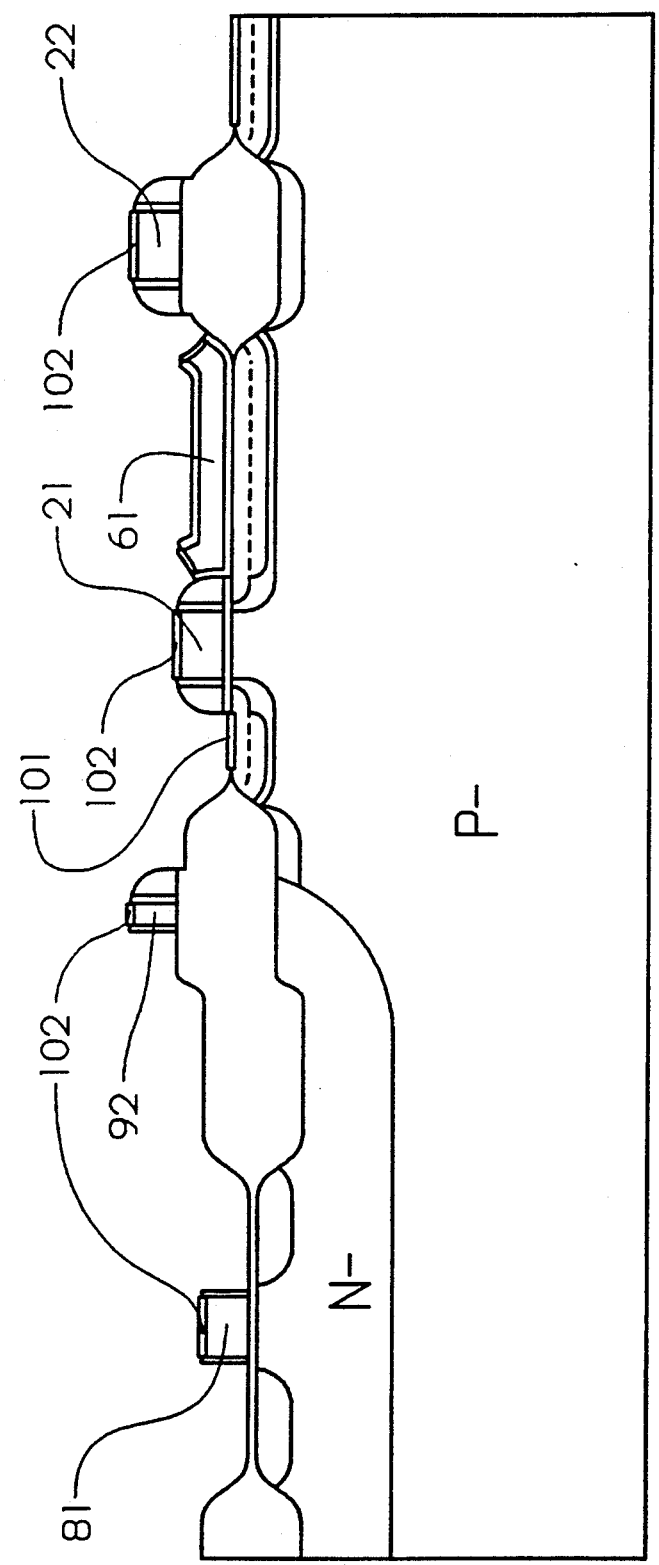
FIG. 10 is a cross-sectional view of the circuit of FIG. 9 following the etching of exposed nitride and silicidation of unoxidized silicon surfaces.

Referring now to FIG. 10, a silicon-clearing nitride etch has removed the silicon nitride on the upper surfaces of N-channel transistor gates 21, P-channel transistor gates 81, the N-channel poly interconnects 22, the P-channel poly interconnects (not shown), hedge 92, in addition to the nitride that covered the future N-channel bit-line contact region 101 and that portion of the second nitride layer that remained on top of the cell plate 61 (if a second nitride layer was deposited). Self-aligned silicidation of these exposed silicon regions then proceeds in a three-step process. A layer of titanium metal is deposited (sputter deposition is one of several usable techniques) on top of all the circuitry. A sintering step performed in a nitrogen ambient causes the titanium to react with all exposed silicon (whether polycrystalline or monocrystalline silicon) to form a titanium silicide layer 102 and to react simultaneously with the ambient nitrogen to form titanium nitride. As the sintering process proceeds, all titanium covering oxide regions is converted to titanium nitride; titanium covering unprotected silicon is converted to an upper layer of titanium nitride and a lower layer of titanium silicide. A sulfuric acid and hydrogen peroxide bath removes all titanium nitride. This self-aligned siliciding step greatly improves the speed of both N-channel and P-channel devices, while adding few additional processing steps to the split-poly CMOS process.

Figure 11:
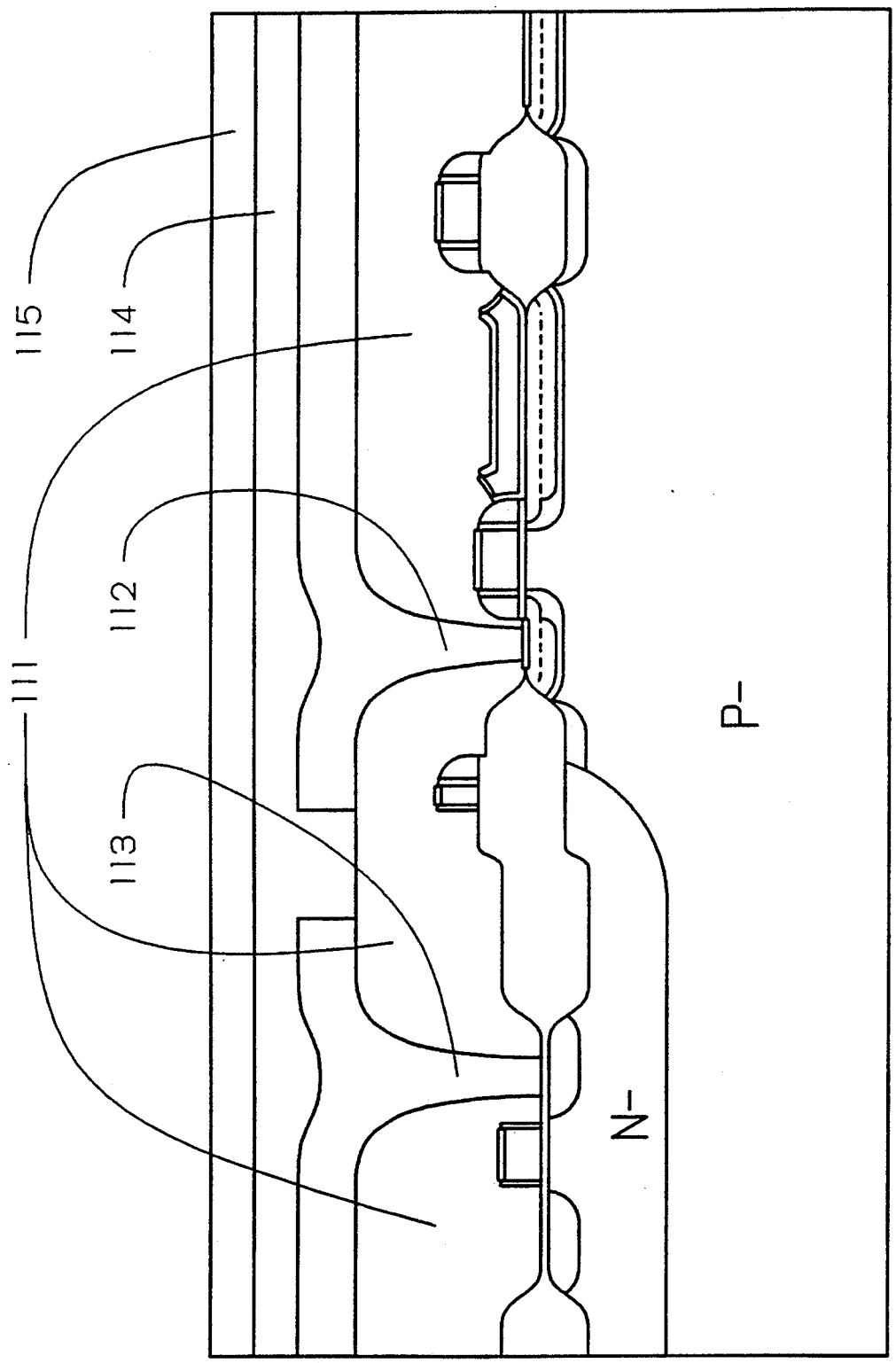
FIG. 11 is a cross-sectional view of the circuit of FIG. 10, completed in a conventional manner.

Referring now to FIG. 11, the circuitry has been completed in a conventional manner by depositing a layer of boro-phospho-silicate glass (BPSG) 111, etching a bit line via and other transistor access vias through the BPSG layer 111, deposition and etching of a metal contact layer to create a bit line 112 and other transistor access lines 113, deposition of a silicon dioxide passivation layer 114 and a final silicon nitride passivation layer 115.

Although only a single embodiment of the improved split-poly CMOS process incorporating self-aligned silicidation of most conductive regions has been described herein, it will be apparent to one skilled in the art that changes and modifications may be made thereto without departing from the spirit and the scope of the invention as claimed. For example, the same process flow could be used to create P-channel and N-channel devices on a lightly-doped N-type substrate (arsenic or phosphorus-doped silicon having a conductivity opposite to that of the lightly-doped P-type substrate used to begin the process described in detail heretofore). In such a case, a P-well, rather than an N-well would be created in the substrate, and so forth. In addition, P-channel transistors—rather than N-channel transistors—could be used for DRAM cell access.

We claim:

1. A split-polysilicon process for creating CMOS DRAM circuitry having self-alignedly silicided transistor gates and N+active areas, on a silicon substrate having both N-type material regions and P-type material regions, both types of said regions being covered by a gate dielectric layer, said process comprising the following sequential steps:

a) blanket deposition of a first polysilicon layer on top of the gate dielectric layer;
   b) masking of said first polysilicon layer with a first photomask which, in P-type material regions, defines N-channel gates and interconnects and in N-type material regions, blankets said first polysilicon layer;
   c) removal of those portions of said first polysilicon layer that are not subjacent to the first photomask with a first polysilicon etch;
   d) stripping of said first photomask;
   e) self-aligned, implant of a P-type conductivity-creating impurity which functions as a punch-through implant in N-channel active areas;
   f) blanket deposition of a silicon dioxide spacer layer;
   g) anisotropically etching the silicon dioxide spacer layer to create N-channel transistor gate spacers and remove all silicon dioxide from N-channel active areas;

h) self-aligned, high-dosage implanting of an N-type conductivity-creating impurity to create heavily-doped drain and source regions for N-channel transistors;
i) blanket deposition of a first silicon nitride layer;
j) blanket deposition of a second polysilicon layer;
k) creation of a second photomask on top of previously deposited layers, said second photomask defining a cell plate;
l) removal of those portions of said second polysilicon layer that are not subjacent to the second photomask with a second polysilicon etch to create the cell plate;
m) stripping of the second photomask;
n) using a third photomask to blanket the P-type material regions and to define the P-channel gates and interconnects in the N-type material regions;
o) removal of those portions of said first nitride layer that are not subjacent to the third photomask with a nitride etch;
p) removal of those portions of the first polysilicon layer that were exposed by the nitride etch with a third polysilicon etch;
q) self-aligned, high-dosage implanting of a P-type conductivity-creating impurity to create heavily-doped drain and source regions for P-channel transistors;
r) oxidation of all exposed silicon, whether of the polycrystalline or monocrystalline types;
s) removal of all exposed silicon nitride with a nitride etch;
t) deposition of a refractory metal layer;
u) sintering of the refractory metal layer to create refractory metal silicide on unoxidized silicon surfaces;
v) removal of all refractory metal that has not been converted to silicide.

2. The process of claim 1, wherein the third polysilicon etch is an isotropic etch.

3. The process of claim 2, wherein the upper surface of the cell plate is self-alignedly silicided by the addition of the following steps:
 a) between steps j) and k), the blanket deposition of a second silicon nitride layer; and
 b) between steps k) and l), the removal of those portions of said second nitride layer that are not subjacent to the third photomask with a nitride etch.

4. The process of claim 2, wherein all polysilicon layers are conductively doped following deposition.

5. The process of claim 2, wherein the refractory metal is titanium.

6. The process of claim 5, wherein the titanium is sintered in a nitrogen ambient, such that as sintering proceeds, all titanium covering silicon dioxide regions is converted to titanium nitride, while titanium covering unprotected silicon is converted to an upper layer of titanium nitride and a lower layer of titanium silicide.

7. The process of claim 6, wherein removal of all titanium nitride is accomplished with a sulfuric acid and hydrogen peroxide bath.

8. The process of claim 1, which further comprises the steps of:
 a) creation of a mini-spacer oxide layer on all exposed silicon surfaces following the punch-through implant of step e); and
 b) prior to step f), the self-aligned, low-dosage implanting of an N-type conductivity-creating impurity to create lightly-doped drain and source regions for N-channel transistors.

9. The process of claim 8, wherein the mini-spacer oxide layer is created through oxidation of all exposed silicon.

10. The process of claim 8, wherein the mini-spacer oxide layer is created through chemical vapor deposition.

* * * * *